United States Patent
Jiang et al.

(10) Patent No.: US 10,205,120 B2
(45) Date of Patent: Feb. 12, 2019

(54) ENCAPSULATING METHOD, DISPLAY PANEL AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Zhiliang Jiang, Beijing (CN); Fengli Ji, Beijing (CN); Renrong Gai, Beijing (CN); Minghua Xuan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 3 days.

(21) Appl. No.: 14/905,504

(22) PCT Filed: Apr. 23, 2015

(86) PCT No.: PCT/CN2015/077286
§ 371 (c)(1),
(2) Date: Jan. 15, 2016

(87) PCT Pub. No.: WO2016/112597
PCT Pub. Date: Jul. 21, 2016

(65) Prior Publication Data
US 2016/0365535 A1 Dec. 15, 2016

(30) Foreign Application Priority Data

Jan. 13, 2015 (CN) .......................... 2015 1 0016717

(51) Int. Cl.
*H01L 27/00* (2006.01)
*H01L 51/52* (2006.01)
(Continued)

(52) U.S. Cl.
CPC .......... *H01L 51/5246* (2013.01); *H01L 27/32* (2013.01); *H01L 51/56* (2013.01)

(58) Field of Classification Search
CPC ...... H01L 51/5246; H01L 27/32; H01L 51/56
See application file for complete search history.

(56) References Cited

U.S. PATENT DOCUMENTS

2007/0176549 A1   8/2007   Park
2010/0044730 A1   2/2010   Kwon et al.
(Continued)

FOREIGN PATENT DOCUMENTS

CN    101009319 A    8/2007
CN    101306920 A    11/2008
(Continued)

OTHER PUBLICATIONS

International Search Report and Written Opinion both dated Oct. 29, 2015; PCT/CN2015/077286.
(Continued)

*Primary Examiner* — Mounir Amer
*Assistant Examiner* — Alexander Belousov
(74) *Attorney, Agent, or Firm* — Ladas & Parry LLP

(57) ABSTRACT

An encapsulating method, a display panel and a display apparatus, the encapsulating method including: forming a frit layer in an encapsulating area of a first substrate; forming a glass network modifier oxide layer on the surface of the frit layer; a first-sintering for the frit layer and the glass network modifier oxide layer; and aligning and attaching the first substrate and a second substrate, and forming an encapsulating structure through irradiating the encapsulating area by a laser. The encapsulating method can improve the liquidity of the surface of the frit layer and make the surface of the frit planarization after sintering at high temperature, so that the production of the holes of the surface of the frit layer can be (Continued)

reduced in the process of being encapsulated by a laser, and then the effect of encapsulating is improved.

13 Claims, 3 Drawing Sheets

(51) Int. Cl.
*H01L 51/56* (2006.01)
*H01L 27/32* (2006.01)

(56) References Cited

U.S. PATENT DOCUMENTS

| | | | |
|---|---|---|---|
| 2011/0209813 | A1 | 9/2011 | Shibuya et al. |
| 2012/0139001 | A1 | 6/2012 | Eberhardt et al. |
| 2015/0022983 | A1* | 1/2015 | Ruben ................ H01L 21/2007 361/762 |
| 2015/0367598 | A1* | 12/2015 | Ruben ................ H01L 21/2007 361/761 |

FOREIGN PATENT DOCUMENTS

| | | |
|---|---|---|
| CN | 102203026 A | 9/2011 |
| CN | 102256909 A | 11/2011 |
| CN | 102701591 A | 10/2012 |
| CN | 103165821 A | 6/2013 |
| CN | 104538561 A | 4/2015 |

OTHER PUBLICATIONS

First Chinese Office Action dated Apr. 25, 2016; Appl. No. 201510016717.X.

* cited by examiner

ENCAPSULATING METHOD, DISPLAY PANEL AND DISPLAY APPARATUS

TECHNICAL FIELD

At least one embodiment of the present disclosure relates to an encapsulating method, a display panel and a display apparatus.

BACKGROUND

In recent years, the organic light emitting diode display (OLED) as an emerging flat-panel display has received extensive concern. But the traditional OLED device, especially the low work function electrode and the organic functional layer therein, tends to degrade in performance because oxygen and moisture in the surrounding environment enter into the OLED device, this will seriously affect the service life of the OLED. If the OLED device is sealed in a water-free and an oxygen-free condition, the life of the display device can be significantly extended, therefore, an encapsulating technical of the OLED device becomes the key process of improving the life of the OLED display device, and researching and developing an effective encapsulating technical to block water vapor and oxygen becomes an urgent task to be settled.

SUMMARY

Embodiments of the present disclosure provide an encapsulating method, a display panel and a display apparatus, to improve the sealing effect of the encapsulation.

At least one embodiment of the present disclosure provides an encapsulating method, and the encapsulating method comprising: forming a frit layer in an encapsulating area of a first substrate; forming a glass network modifier oxide layer on a surface of the frit layer; first-sintering the frit layer and the glass network modifier oxide layer; and aligning and attaching the first substrate with a second substrate, and irradiating the encapsulating area by a laser to form an encapsulating structure.

At least one embodiment of the present disclosure further provides a display panel, and the display panel comprises a first substrate, a second substrate and an encapsulating structure which is disposed in an encapsulating area to seal the first substrate and the second substrate, wherein, the encapsulating structure comprises an encapsulating glass layer and a glass network modifier oxide layer with the encapsulating glass layer being between the first substrate and the second substrate and the glass network modifier oxide layer being between the encapsulating glass layer and the second substrate.

At least one embodiment of the present disclosure further provides a display apparatus comprising the above-mentioned display panel.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
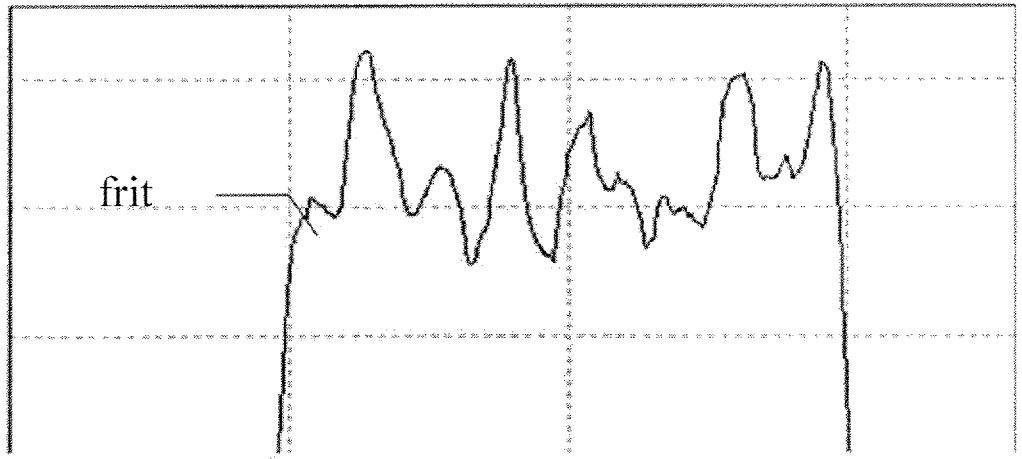
FIG. 1 is an amplified morphology schematic diagram of the surface of the frit after sintering at high temperature during the process of encapsulating.

At present, in a traditional process of encapsulating the cover plate, the encapsulation cover plate and the array substrate are encapsulated by the frit. However, in the study, the inventor of the present disclosure has noticed that, in the specific encapsulating process, after sintering the frit formed on the encapsulation cover plate at high temperature, as shown in FIG. 1, the surface of the frit is usually uneven, such that the subsequent irradiating by a laser will make an elastic displacement of the surface of the frit, and in turn a lot of holes will be formed in one side of the OLED device which is close to the surface of the frit, thus the sealing effect is reduced.

Figure 2A:
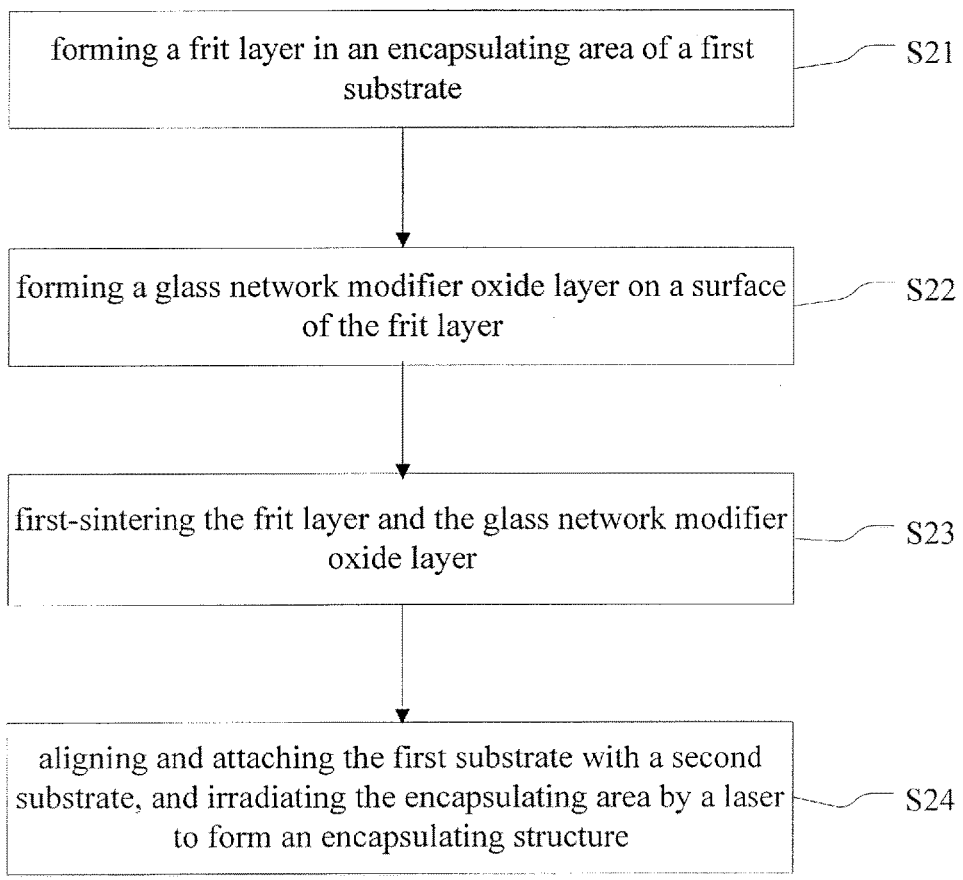
FIG. 2a is a flow diagram of an encapsulating method provided by an embodiment of the present disclosure.

FIG. 2a is a flow diagram of an encapsulating method provided by an embodiment of the present disclosure, the encapsulating method comprises: step S21: forming a frit layer in an encapsulating area of a first substrate; step S22: forming a glass network modifier oxide layer on a surface of the frit layer; step S23: first-sintering the frit layer and the glass network modifier oxide layer; and step S24: aligning and attaching the first substrate with a second substrate, and irradiating the encapsulating area by a laser to form an encapsulating structure.

With the encapsulating method provided by the embodiment of the present disclosure, forming a glass network modifier oxide layer on the surface of the frit can improve the liquidity of the surface of the frit layer and planarize the surface of the frit after sintering at high temperature, so that the production of the holes in the surface of the frit layer is reduced in the process of being encapsulated by a laser, and the effect of encapsulating is improved.

The above-mentioned encapsulating method provided by the embodiment of the present disclosure can be applied to the encapsulating of the OLED display panel, and in the above-mentioned encapsulating method, the first substrate can be an encapsulation cover plate (which may be a glass substrate) or an array substrate (a TFT substrate), and the first substrate is not limited herein, whereas in the case that the first substrate is an encapsulation cover plate, the second substrate is an array substrate; and in the case that the first substrate is an array substrate, the second substrate is an encapsulation cover plate.

For example, in the case of a frit layer is formed on an encapsulation cover plate, the above-mentioned encapsulating method may comprise step S31 to step S34, these steps will be introduced one by one.

Figure 2B:
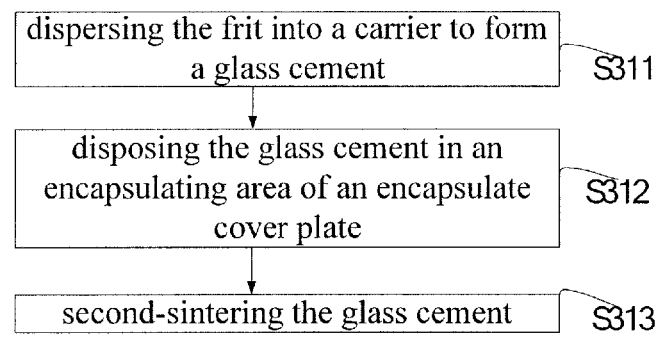
FIG. 2b is a flow diagram of forming a frit layer in the encapsulating area of the encapsulation cover plate provided by an embodiment of the present disclosure.

Step S31: forming a frit layer in an encapsulating area of an encapsulation cover plate. As shown in FIG. 2b, the step for example may comprise the following step S311 to step S313.

Step S311: dispersing the frit into a carrier (which can be an organic solvent) to form a glass cement. For example, the composition of the frit can be a $V_2O_5$—$P_2O_5$ system, it mainly includes: $V_2O_5$, $P_2O_5$, ZnO, $Fe_2O_3$, $TiO_2$ and so on. Besides, for example, the frit can also be mixed with a non-conductive high temperature ceramic powder, so as to reduce the overall liquidity of the frit layer in melting state, so that the extent of decrease in the thickness of the frit stripe after being encapsulated by a laser as compared to before being encapsulated is reduced, and in turn further enhance the following up sealing performance of the OLED device. Besides, for example, the frit can also be mixed with a small amount of glass network modifier oxide. A glass network modifier oxide is a good fluxing agent for a glass, and the glass network modifier oxide mixed into the frit can reduce the viscosity and increase the liquidity of the glass in liquid state, can improve the crystallization properties of the glass, so that the glass tends to melt; however, because it can also improve the thermal expansion coefficient of the glass and reduce the thermal stability, chemical stability and mechanical strength of the glass, therefore, in order to avoid having a negative effect on the overall physical and chemical characteristics of a frit, and avoid the overall liquidity of a frit layer in melting state being so high to cause significant decrease in the thickness of the frit stripe after being encapsulated by a laser as compared to before being encapsulated and in turn to cause reducing the sealing effect, the content of the glass network modifier oxide in the frit should not be too high, for example the content can be 1%-3%.

Step S312: disposing the glass cement in an encapsulating area of an encapsulation cover plate. For example, firstly the encapsulation cover plate is cleaned, and then is dried by blow air, and then the glass cement is transferred to the encapsulation cover plate by screen printing.

Step S313: second-sintering the glass cement. For example, the second-sintering can be carried out at a temperature of 120° C.-150° C., for example, 125° C., 130° C. 135° C. etc, the organic solvent in the glass cement can be evaporated through the second-sintering, thus the frit can be formed in the encapsulating area of the encapsulation cover plate.

Step S32: forming a glass network modifier oxide layer on the surface of the frit.

Figure 3:
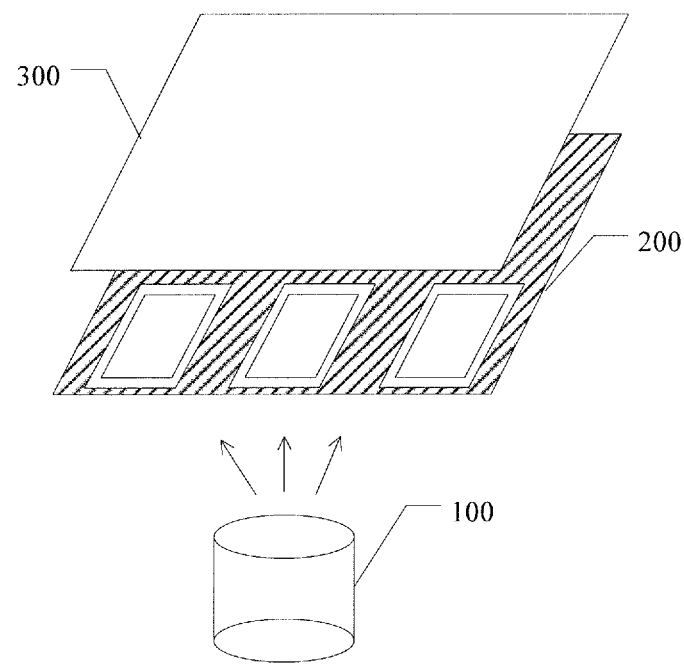
FIG. 3 is a schematic diagram of forming a glass network modifier oxide layer on the surface of the frit provided by an embodiment of the present disclosure.

For example, a material of the glass network modifier oxide layer can comprises one or more selected from the group consisting of $Na_2O$ and $K_2O$. For example, the material of the glass network modifier oxide layer is formed on the surface of the frit through a method of vapor deposition or sputtering to obtain the glass network modifier oxide layer. For example, as shown in FIG. 3, the material 100 of the glass network modifier oxide can be formed on the encapsulation cover plate 300 by the mask plate 200. For example, the thickness of the glass network modifier oxide layer is 0.5 nm-10 nm, for example, 1 nm, 3 nm, 5 nm, 8 nm and so on.

Step S33: first-sintering the frit and the glass network modifier oxide layer. In at least one embodiment, the temperature of the first-sintering can be 350° C.-550° C., for example, 380° C., 450° C., 500° C. and so on. For example, the encapsulation cover plate can be put into the environment of the above-mentioned temperature and sintered at high temperature, thus the frit and the glass network modifier oxide layer are melt to further strengthen the connectivity of the frit and the glass network modifier oxide layer.

Step S34: aligning and attaching the encapsulation cover plate with the array substrate, and irradiating the encapsulating area by a laser to form an encapsulating structure.

With the encapsulating method provided by the embodiment of the present disclosure, firstly, only a small amount of glass network modifier oxide and a non-conductive high temperature ceramic powder are mixed into the frit, so as to reduce the overall liquidity of the frit layer in melting state, so that the extent of decrease in the thickness of the frit stripe after being encapsulated by a laser as compared to before being encapsulated is reduced, after that a glass network modifier oxide layer is added on the surface of the frit layer upon the frit layer is disposed on the encapsulation cover plate, thus achieve the enhancement of its surface liquidity provided that the increase in the overall liquidity of a frit layer is avoid as far as possible. Further the surface of the frit layer is planarized after sintering at high temperature and the production of holes in the surface of the frit layer is reduced in the process of being encapsulated by a laser, and the encapsulating effect is improved.

Figure 4:
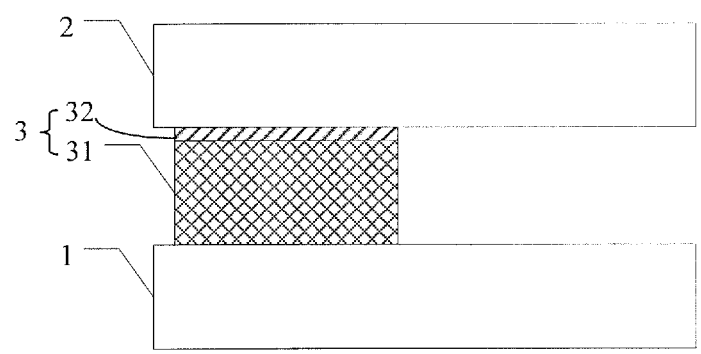
FIG. 4 is a schematic diagram of a display panel provided by an embodiment of the present disclosure.

Besides, refer to FIG. 4, FIG. 4 is a schematic diagram of a display panel provided by an embodiment of the present disclosure, the display panel comprises a first substrate 1, a second substrate 2 and a encapsulating structure 3 which is disposed in an encapsulating area to seal the first substrate 1 and the second substrate 2, wherein, the encapsulating structure 3 comprises an encapsulating glass layer 31 and a glass network modifier oxide layer 32 with the encapsulating glass layer being between the first substrate 1 and the second substrate 2 and the glass network modifier oxide layer being between the encapsulating glass layer 31 and the second substrate 2.

The display panel provided by the embodiment of the present disclosure can be an OLED display panel, wherein it can also comprise an OLED device which is disposed between the first substrate and the second substrate. And in the above-mentioned display panel, the first substrate can be an encapsulation cover plate or an array substrate, and the first substrate is not limited herein, whereas in the case of the first substrate is an encapsulation cover plate, the second substrate is an array substrate; in the case of the first substrate is an array substrate, the second substrate is an encapsulation cover plate.

For example, the material of the glass network modifier oxide layer is one or more selected from the group consisting of $Na_2O$ and $K_2O$.

Besides, an embodiment of the present invention further provides a display apparatus comprising the above-mentioned display panel. The display apparatus provided by the embodiment of the present disclosure can be a notebook computer screen, a liquid crystal display, an OLED display, a liquid crystal television, a digital picture frame, a mobile phone, a tablet computer and other products or components having a display function.

The above are only the model implementation ways of the present disclosure, and not used to limit the scope of protection of the present disclosure, the scope of protection of the present disclosure is determined by the attached claims.

The present application claims the priority of the Chinese Patent Application No. 201510016717.X filed on Jan. 13, 2015, which is incorporated herein by reference as part of the disclosure of the present application.

The invention claimed is:

1. An encapsulating method, comprising:
   forming a frit layer in an encapsulating area of a first substrate;
   forming a glass network modifier oxide layer on a surface of the frit layer;
   first-sintering the frit layer and the glass network modifier oxide layer; and
   aligning and attaching the first substrate with a second substrate, and irradiating the encapsulating area by a laser to form an encapsulating structure;
   wherein the glass network modifier oxide layer consists of one or more selected from the group consisting of $Na_2O$ and $K_2O$.

2. The encapsulating method according to claim 1, wherein, forming of the frit layer in the encapsulating area of the first substrate comprises:
   dispersing a frit in a carrier to form a glass cement;
   disposing the glass cement in the encapsulating area of the first substrate; and
   second-sintering the glass cement.

3. The encapsulating method according to claim 2, wherein the second-sintering is carried out at a temperature of 120° C.-150° C.

4. The encapsulating method according to claim 2, wherein, the material of the glass network modifier oxide layer is formed on the surface of the frit layer through a method of vapor deposition or sputtering to obtain the glass network modifier oxide layer.

5. The encapsulating method according to claim 4, wherein, the first-sintering is carried out at a temperature of 350° C.-550° C.

6. The encapsulating method according to claim 5, wherein, the glass network modifier oxide layer has a thickness ranged from 0.5 nm to 10 nm.

7. The encapsulating method according to claim 1, wherein, the material of the glass network modifier oxide layer is formed on the surface of the frit layer through a method of vapor deposition or sputtering to obtain the glass network modifier oxide layer.

8. The encapsulating method according to claim 1, wherein, the first-sintering is carried out at a temperature of 350° C.-550° C.

9. The encapsulating method according to claim 1, wherein, the glass network modifier oxide layer has a thickness ranged from 0.5 nm to 10 nm.

10. A display panel, comprising a first substrate, a second substrate and an encapsulating structure which is disposed in an encapsulating area to seal the first substrate and the second substrate, wherein, the encapsulating structure comprises an encapsulating glass layer and a glass network modifier oxide layer with the encapsulating glass layer being between the first substrate and the second substrate and the glass network modifier oxide layer being between the encapsulating glass layer and the second substrate; the glass network modifier oxide layer consists of one or more selected from the group consisting of $Na_2O$ and $K_2O$.

11. The display panel according to claim 10, wherein, the glass network modifier oxide layer has a thickness ranged from 0.5 nm to 10 nm.

12. A display apparatus, comprising the display panel according to claim 10.

13. The display apparatus according to claim 12, wherein, the glass network modifier oxide layer has a thickness ranged from 0.5 nm to 10 nm.

* * * * *